United States Patent
Halpin

(10) Patent No.: US 7,166,165 B2
(45) Date of Patent: Jan. 23, 2007

(54) BARRIER COATING FOR VITREOUS MATERIALS

(75) Inventor: Michael W. Halpin, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 189 days.

(21) Appl. No.: 09/828,550

(22) Filed: Apr. 6, 2001

(65) Prior Publication Data

US 2002/0011211 A1 Jan. 31, 2002

Related U.S. Application Data

(60) Provisional application No. 60/195,561, filed on Apr. 6, 2000.

(51) Int. Cl.
*C23C 16/00* (2006.01)
*C23F 1/00* (2006.01)
*H01L 21/306* (2006.01)

(52) U.S. Cl. ............................ 118/715; 156/345.29

(58) Field of Classification Search ............. 118/725, 118/723 R, 715; 156/345.1, 345.37, 345.29; 219/390
See application file for complete search history.

(56) References Cited

U.S. PATENT DOCUMENTS

| | | | | |
|---|---|---|---|---|
| 154,695 | A | 9/1874 | Manly | 131/309 |
| 3,011,006 | A | 11/1961 | Nicholson | 136/232 |
| 4,377,347 | A | 3/1983 | Hanmyo et al. | 374/139 |
| 4,592,307 | A | 6/1986 | Jolly | 118/719 |
| 4,692,556 | A | 9/1987 | Bollen et al. | 136/234 |
| 4,976,996 | A | 12/1990 | Monkowski et al. | 427/255.5 |
| 4,978,567 | A | 12/1990 | Miller | 428/157 |
| 4,984,904 | A | 1/1991 | Nakano et al. | 374/139 |
| 5,027,746 | A | 7/1991 | Frijlink | 118/724 |
| 5,065,698 | A * | 11/1991 | Koike | 118/719 |
| 5,104,514 | A * | 4/1992 | Quartarone | 205/203 |
| 5,246,500 | A | 9/1993 | Samata et al. | 118/719 |
| 5,271,967 | A * | 12/1993 | Kramer et al. | 427/455 |
| 5,315,092 | A | 5/1994 | Takahashi et al. | 219/497 |

(Continued)

FOREIGN PATENT DOCUMENTS

EP    0 229 488    12/1986

(Continued)

OTHER PUBLICATIONS

J. Linke and E. Vietzke, "Behavior of Boron Doped Graphites, Plasma Sprayed Boron Carbides and a-C/B:H as Plasma Facing Material", J. Fusion Tech. V.20, pp. 228-231, Sep. 1991.*

(Continued)

*Primary Examiner*—Rudy Zervigon
(74) *Attorney, Agent, or Firm*—Knobbe, Martens, Olson & Bear, LLP.

(57) ABSTRACT

A chemical vapor deposition apparatus comprises a reaction chamber and one or more vitreous components having an outer surface that is covered at least in part by a devitrification barrier layer. In some arrangements, the one or more vitreous components can include a thermocouple. In a preferred arrangement, the devitrification barrier coating is formed from silicon nitride, which can be deposited on the vitreous component using chemical vapor deposition (CVD).

25 Claims, 4 Drawing Sheets

U.S. PATENT DOCUMENTS

| | | | |
|---|---|---|---|
| 5,336,327 A | 8/1994 | Lee | 118/730 |
| 5,360,269 A | 11/1994 | Ogawa et al. | 374/140 |
| 5,421,893 A | 6/1995 | Perlov | 118/725 |
| 5,456,761 A | 10/1995 | Auger et al. | 136/232 |
| 5,474,618 A | 12/1995 | Allaire | 136/234 |
| 5,493,987 A * | 2/1996 | McDiarmid et al. | 117/102 |
| 5,514,439 A | 5/1996 | Sibley | 428/64.1 |
| 5,562,774 A | 10/1996 | Breidenbach et al. | 118/715 |
| 5,571,333 A | 11/1996 | Kanaya | 118/724 |
| 5,788,799 A * | 8/1998 | Steger et al. | 156/345.37 |
| 5,902,407 A | 5/1999 | deBoer et al. | 118/725 |
| 5,904,778 A * | 5/1999 | Lu et al. | 118/723 R |
| 5,910,221 A * | 6/1999 | Wu | 118/723 R |
| 6,056,823 A * | 5/2000 | Sajoto et al. | 118/715 |
| 6,066,209 A * | 5/2000 | Sajoto et al. | 118/715 |
| 6,120,640 A * | 9/2000 | Shih et al. | 156/345.1 |
| 6,129,808 A * | 10/2000 | Wicker et al. | 156/345.1 |
| 6,170,429 B1 * | 1/2001 | Schoepp et al. | 118/723 R |
| 6,227,140 B1 * | 5/2001 | Kennedy et al. | 118/723 R |
| 6,325,858 B1 * | 12/2001 | Wengert et al. | 118/725 |
| 6,342,691 B1 * | 1/2002 | Johnsgard et al. | 219/390 |
| 2003/0035905 A1 | 2/2003 | Lieberman et al. | 427/569 |

FOREIGN PATENT DOCUMENTS

| | | |
|---|---|---|
| EP | 95309495.0 | 12/1995 |
| JP | 5-64627 | 5/1993 |
| WO | WO95/31582 | 11/1995 |
| WO | WO97/06288 | 2/1997 |
| WO | WO 99/23276 | 5/1999 |
| WO | 01/11223 | 11/2002 |

OTHER PUBLICATIONS

Srihari Ponnekanti et al, "Failure mechanisms of anodized aluminum parts used in chemical vapor deposition chambers", J. Vac. Sci. Technol. A 14(3), May 1, 1996.*

Introduction to Materials Science for Engineers, 3rd Ed. James F. Shackelford, 1992 Macmillan Publishing Co., pp. 398.*

Pending Application: U.S. Appl. No. 09/184,490, filed Nov. 2, 1998, entitled Long Life High Temperature Process Chamber, in the name of Wengert et al. and assigned to ASM America, Inc.

* cited by examiner

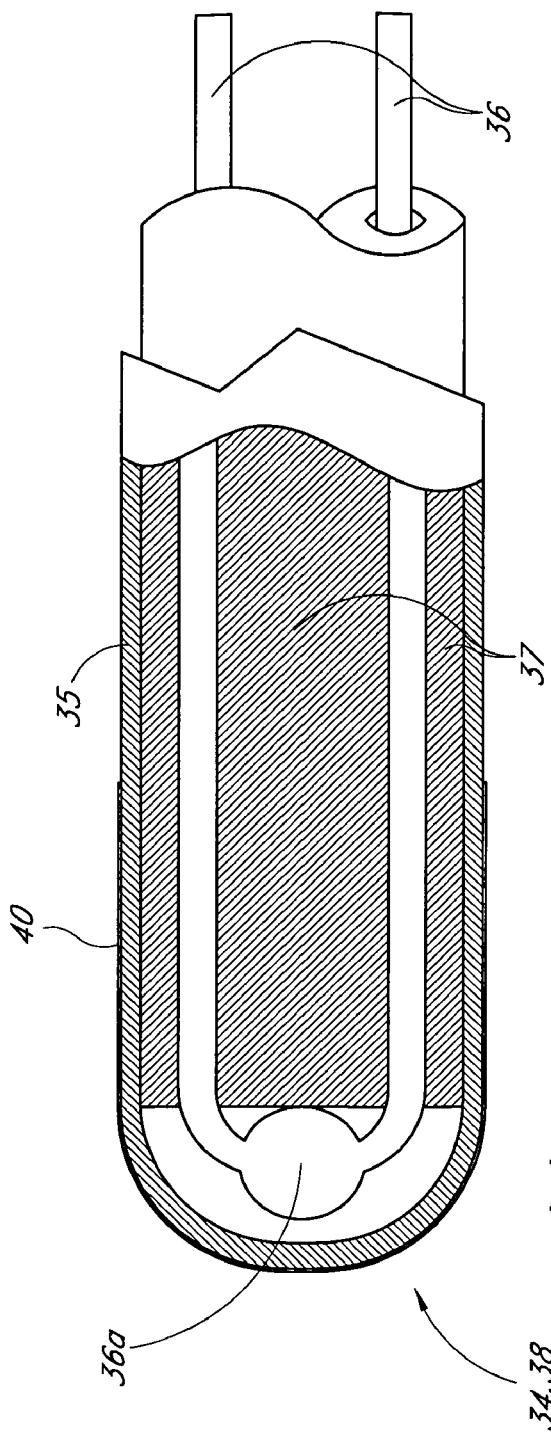
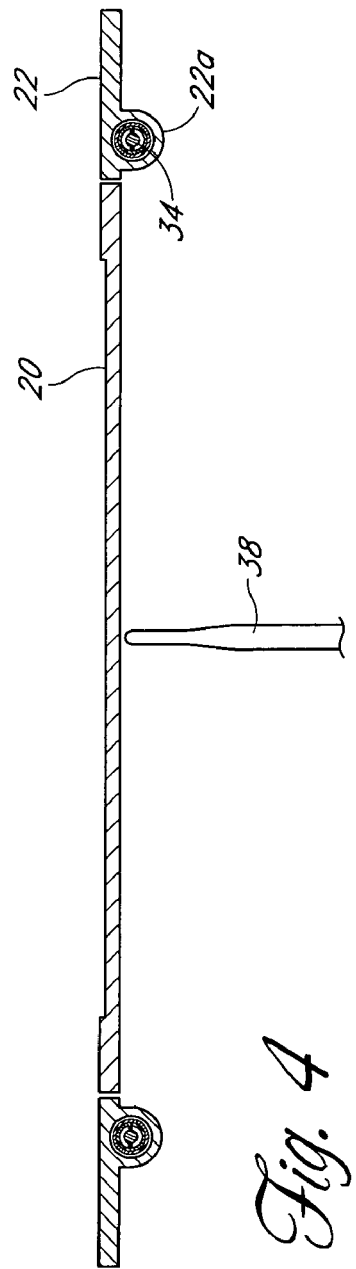
Fig. 3
Fig. 4

BARRIER COATING FOR VITREOUS MATERIALS

RELATED APPLICATION

This application claims the priority benefit under 35 U.S.C. § 119(e) of Provisional Application No. 60/195,561 filed Apr. 6, 2000.

FIELD OF THE INVENTION

This invention relates to the field of protective coatings, specifically the use of protective coatings to prevent damage to vitreous materials in corrosive environments. More particularly, this invention relates to the use of protective coatings to limit the devitrification of quartz components in a semiconductor reactor.

BACKGROUND AND SUMMARY OF THE INVENTION

High-temperature ovens, which are typically called reactors, can be used to create structures of very fine dimensions, such as, for example, integrated circuits on semiconductor wafers or other substrates. The one or more substrates, such as, for example silicon wafers, are placed on a wafer support inside a reaction chamber of the reactor. Inside the reaction chamber, both the wafer and the support (also called a susceptor) are heated to a desired temperature. In a typical wafer treatment step, reactant gases are passed over the heated wafer, causing the chemical vapor deposition (CVD) of a thin layer of the reactant material on the wafer. If the deposited layer has the same crystallographic structure as the underlying silicon wafer, it is called an epitaxial layer. This layer is also sometimes called a monocrystalline layer because it has only one crystal structure.

"Cold wall" reaction chambers are a type of reaction chamber that are desirably made of quartz (vitreous silica) or other similar materials which are substantially transparent to the radiant energy used for heating the chamber. Quartz is also desirable because it can withstand very high temperatures, and because it is relatively inert (i.e., it does not react with various processing gases typically used in semiconductor processing). Quartz is also typically used to build a number of other reactor components, comprising spiders, which are used to support the susceptors, and stands, which are used to support temperature compensation rings around the periphery of the susceptors. Due to its material characteristics, quartz components are also advantageous for other types of reactors that do not use radiant heating systems.

To ensure the high quality of the resulting layers on the wafers, various process parameters must be carefully controlled. One such critical parameter is the temperature of the reactor and the wafer during each treatment step of the processing. During CVD, for example, the deposition gases react at particular temperatures and deposit on the wafer. For silicon deposition, for example, deposition temperatures can affect the crystal structure of the resultant layers, from amorphous at low temperatures to polycrystalline at intermediate temperatures, to epitaxial (single crystal) at high temperatures. If the temperature varies across the surface of the wafer, uneven deposition rates can result at different points across the wafer, leading to non-uniform thicknesses. Accordingly, it is important that the wafer temperature be stable and uniform at the desired temperature both before the treatment begins and during deposition. Similarly, non-uniformity or instability of temperatures across a wafer during other thermal treatments can affect the uniformity of resulting structures. Other processes for which temperature control can be critical include oxidation, nitridation, dopant diffusion, sputter depositions, photolithography, dry etching, plasma processes, and high temperature anneals.

Typically, semiconductor reactors are operated at relatively high temperatures. The reactor can be frequently cycled up and down from these relatively high temperatures to relatively cold temperatures. Thermocouples are often used to monitor temperatures within the reactor. However, because of the corrosive environments present in the reactor, the thermocouple is typically surrounded by a protective sheath. For example, the thermocouple is coaxially inserted into the protective sheath such that the heat-sensing junction of the thermocouple is placed adjacent to the bottom of the protective sheath. Accordingly, the thermocouple senses the temperature of the reactor through the protective sheath. Such sheaths should be made of a material that withstands high temperatures and thermal cycling as well as the corrosive processing environment. Further, the sheath material should have good thermal conductivity, whereby the sheathed thermocouple will rapidly react to temperature fluctuations. For semiconductor processing applications, the protective sheath is desirably chemically inert and of a suitable chemical purity to avoid contaminating the wafer during processing.

The thermocouples used to measure temperature in CVD reactors are typically protected with quartz sheaths. The inventors have found that, while these quartz sheaths are useful in protecting the thermocouple during wafer processing, in corrosive environments frequent thermal cycling of the quartz sheath to temperatures in excess of 1000° C. can cause devitrification of the quartz sheath. Even in non-corrosive environments, frequent thermal cycling of the quartz sheath to temperatures in excess of approximately 1250° C. can cause devitrification. Some processes, like epitaxy, typically occur at temperatures of 1150° C. or higher. Devitrification is a second order phase transition of amorphous quartz into cristobalite. Devitrification begins at naturally occurring nucleation sites in the amorphous quartz. This phase transition results in a twenty percent density change causing stresses to build up in the cristobalite. When the quartz sheath is allowed to cool down to approximately 275° C. or below, the crystallographic inversion temperature range, the cristobalite cracks. This cracking ultimately causes the sheath to lose its protective function, leading to subsequent failure of the thermocouple, necessitating its replacement.

The need to replace thermocouples, and various other chamber components subject to devitrification, naturally results in downtime for the reactor and significant costs for replacement components. In addition, there is significant time and expense in returning the reactor to the operating conditions necessary to produce the desired film properties on the wafers being coated. Replacing thermocouples and other components requires an intrusion into the chamber which can result in undesirable particle generation. The cristobalite transition, and resultant cracking, occurs most frequently at the tip of the thermocouple sheath where it contacts, or is in close proximity to, the hot susceptor. However, in addition to thermocouple sheaths, other quartz reactor components are potentially subject to the same problems of devitrification. Although the problem of devitrification of quartz into cristobalite has been described herein above, any family of amorphous glass is subject to undesirable devitrification.

Exposing quartz to acidic environments, in combination with high temperatures, exacerbates its devitrification. Although cristobalite can form at temperatures at or above 1150° C. in the absence of an acidic environment, the rate of cristobalite formation in an acidic environment is much more rapid. Many CVD processes, e.g., etching, are performed in acidic environment. Reactor cleaning procedures also introduce acid into the chamber. Generally, in CVD reactors, the reactant material not only deposits on the substrate, as is desired, but some material is also deposited on the reactor walls and other components within the reactor. Periodically, in order to maintain a repeatable process, the reactor has to be cleaned. Reactor cleaning typically occurs by heating the wafer support, reactor walls and other reactor components to a suitably high temperature and admitting a flow of a halogen containing gas, for example HCl. Other typical cleaning gases include $Cl_2$, $NF_3$, $ClF_3$, or mixtures thereof.

There is a need to significantly extend the life of quartz and other vitreous materials used as thermocouple sheaths and for other components within a CVD chamber. Known methods of protecting thermocouples are prohibitively expensive, cannot be used to protect complex components because of fabrication constraints, are a source of contaminants, or are otherwise incompatible with the high temperatures and acidic conditions found in CVD reactors. Therefore, there exists a need to protect quartz and other vitreous materials in an economical manner and without negatively affecting the beneficial properties of these materials.

In satisfaction of this need, the preferred embodiments of the invention provide for a chemical vapor deposition reactor for the processing of semiconductor substrates, wherein the lifetimes of some internal reactor components made of vitreous materials are extended by coating them with a barrier material layer selected for this purpose.

In one arrangement of the invention, a reaction chamber is in the form of a horizontally oriented quartz tube divided into an upper region and a lower region by a front divider plate, a susceptor surrounded by a temperature compensation or slip ring, and a rear divider plate. Mounted adjacent to the susceptor are one or more thermocouples each having a sheath made of a vitreous material which is coated with a barrier material layer which is more durable than vitreous material itself. When coated with the barrier material layer, the thermocouple sheath does not devitrify upon high temperature cycling and, thus, the life of the thermocouple sheath is greatly extended over that of previously used uncoated sheaths. The barrier material layer is especially useful in acidic environments.

In accordance with another arrangement, protective barrier layers are provided on various parts of the chamber to protect quartz reactor components from devitrification. A protective barrier is provided over a quartz sheath covering a thermocouple, thereby protecting the quartz from the processing gases. Protective barrier layers may also be used to cover, either partially or fully, other quartz components, such as the quartz spider supporting the susceptor or the quartz stand supporting the slip ring. It is expected that protecting quartz sheathed thermocouples and quartz components with barrier coatings will significantly increase their lifetime.

In accordance with another aspect of the invention, a method is provided for forming barrier material layers on vitreous materials. Advantageously, the method includes depositing a barrier material selected for this purpose in such a manner that the barrier layer is thin and has good adherence to the underlying vitreous material, resulting in a layer with reasonable thermal conductivity.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 3 is an enlarged cross-sectional view of a thermocouples, constructed in accordance with a preferred embodiment of the invention.

FIG. 4 is a cross-sectional view showing a substrate having a plurality of thermocouples proximate a substrate support.

DETAILED DESCRIPTION OF THE PREFERRED EMBODIMENTS

Figure 1:
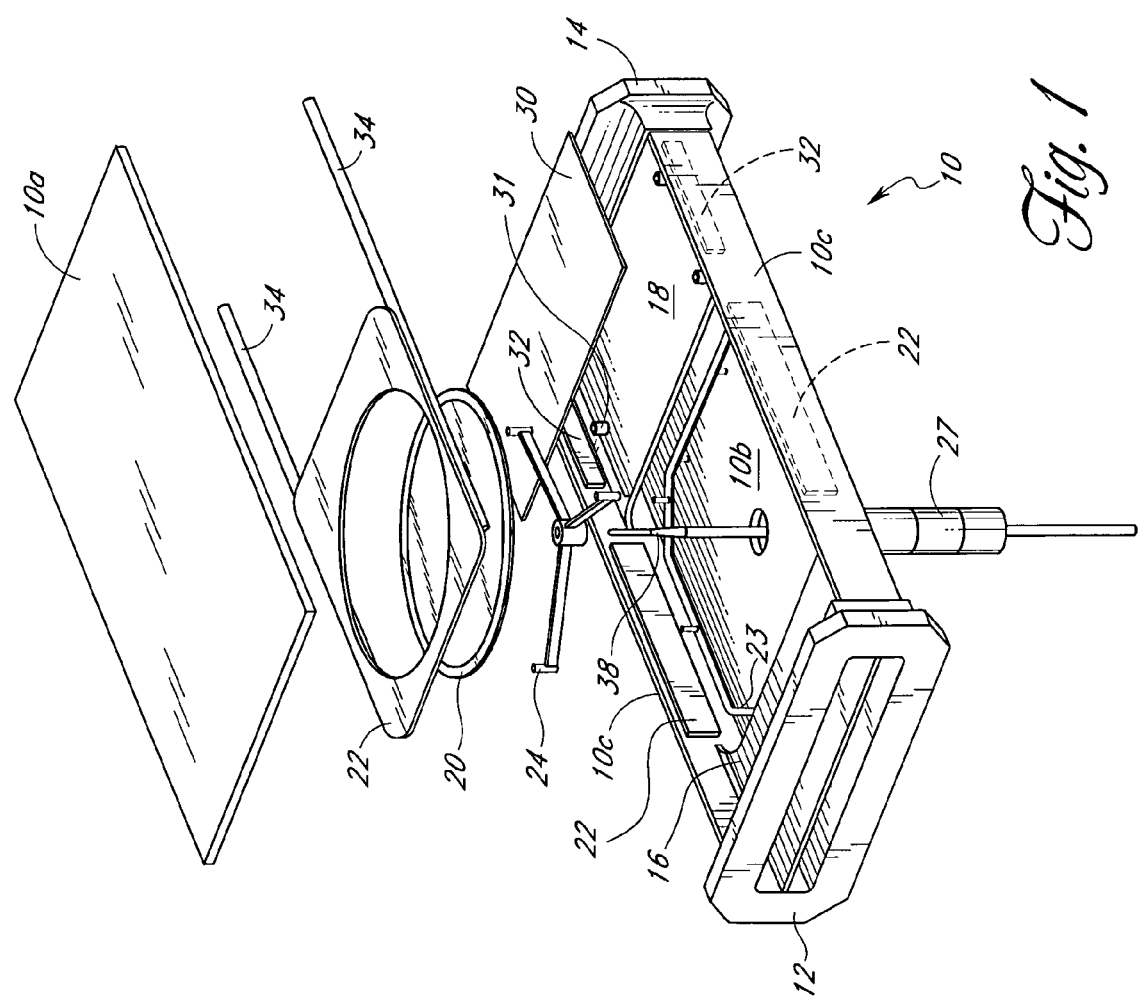
FIG. 1 is an exploded perspective view of an exemplary chamber containing components that may be protected with a barrier layer.

FIGS. to 1 and 2 illustrate an exemplary CVD reactor chamber 10, which provides an environment in which the preferred embodiments of the invention will be described. The illustrated CVD reaction chamber comprises an elongated generally flat rectangular chamber 10 made of quartz. Details of such a chamber are disclosed in pending U.S. patent application Ser. No. 09/184,490 of Wengert et al., filed Nov. 2, 1998 and entitled "LONG LIFE HIGH TEMPERATURE PROCESS CHAMBER". The disclosure of the this application is herein incorporated by reference. Although a horizontal-flow, single-wafer, cold wall reaction chamber is used to describe the invention, it should be appreciated that the invention is applicable to any reaction chamber containing vitreous components subject to devitrification, e.g., dome chambers, vertical reactors, batch reactors, hot wall reactors, etc. The quartz chamber includes a flat upper wall 10a, a flat lower wall 10b joined by a pair of short vertical side walls 10c. A thickened quartz inlet flange 12 extends across the gas inlet end of the chamber attached to the chamber walls. A similar quartz gas outlet flange 14 is shown on the downstream end of the chamber attached to the chamber walls 10a–c.

Figure 2:
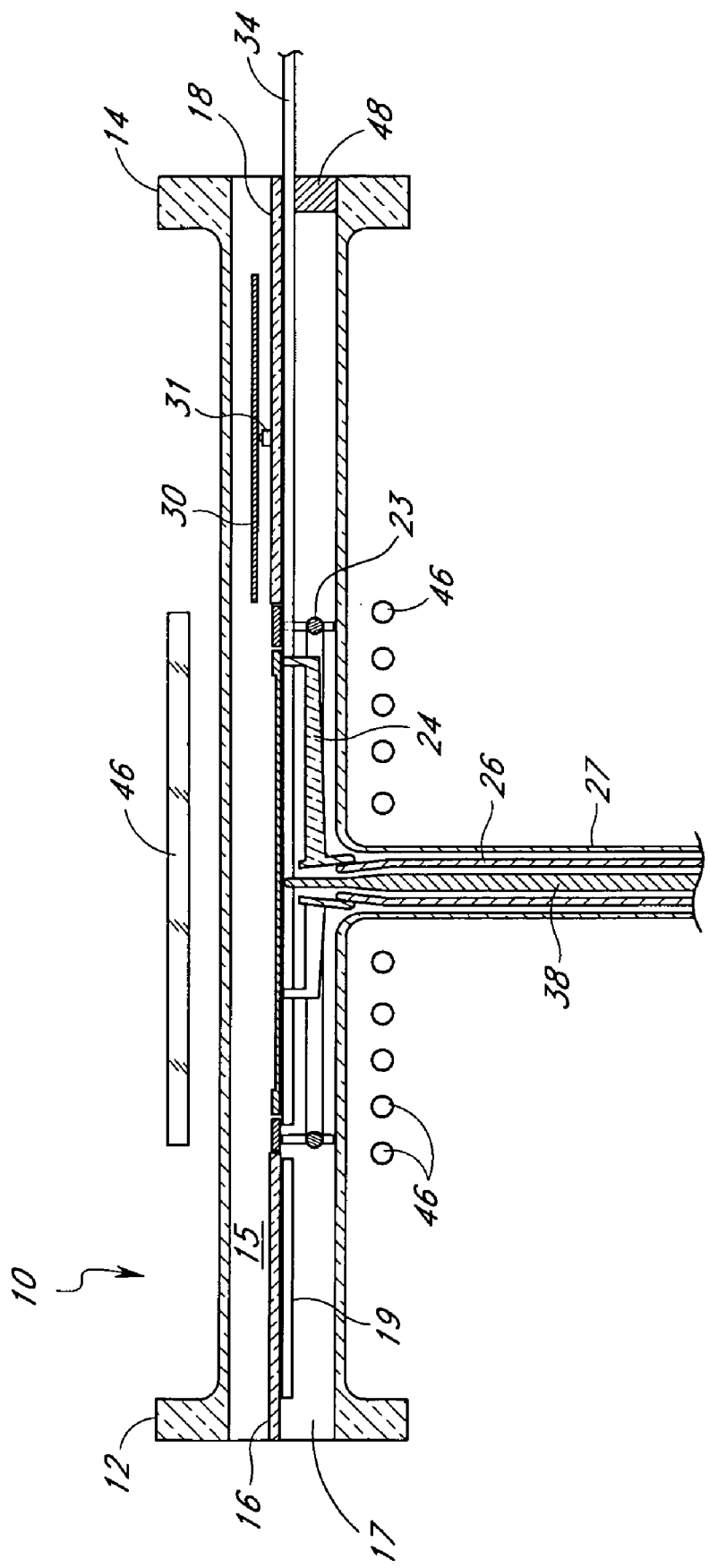
FIG. 2 is a cross-sectional view of the chamber of FIG. 1.

The illustrated chamber is divided into an upper section 15 and a lower section 17 by a quartz flat front or upstream divider plate 16 and a rear, quartz downstream plate 18 extending between the chamber side walls 10c, generally parallel to the upper and lower walls 10a, 10b. The divider plates 16 and 18 are supported by supports 19 (see FIG. 2) formed on the side walls 10c, or by supports (not shown) extending upwardly from the chamber bottom wall. Such supports are typically fabricated of quartz. The rear chamber divider plate 18 is in approximately the same plane as the front plate 16. The chamber 10 is further divided by a generally flat circular susceptor 20 and a surrounding ring 22 (see FIG. 1), sometimes referred to as a temperature compensation ring or a slip ring, which prevents crystallographic slip. The slip ring 22 will be described in more detail below with respect to FIG. 4.

In the illustrated arrangement, the susceptor 20 is supported by a spider 24 has three arms extending radially outwardly from a central hub and has upwardly extending projections 25 on the ends of the arms engaging the susceptor. The spider 24 is mounted on a tubular shaft 26, which extends through the chamber lower wall 10b and also extends through a quartz tube 27 that is attached to and depends from the lower chamber wall 10b. The spider 24 and shaft 26 are preferably fabricated of quartz. The shaft 26 is adapted to be connected to a drive (not shown) for rotating the shaft 26, the spider 24 and the susceptor 20. Details such an arrangement together with a drive mechanism can be found in U.S. Pat. No. 4,821,674, which is incorporated herein by reference.

The ring 22 of the illustrated arrangement is supported by a quartz stand 23 resting on the lower chamber wall 10b. In alternative arrangements, the ring 22 can be supported on quartz ledges extending inwardly from the chamber side walls 10c or on quartz ledges extending from the divider plates 16, 18.

The chamber 10 may contain a number of other components which require support within the chamber 10. For example, in the illustrated arrangement, there is a getter plate 30, positioned downstream from the susceptor 20 and the ring 22. The illustrated getter plate 30 is supported on a plurality of pins 31 extending upwardly from the rear chamber divider plate 18. In alternative arrangements, more than one getter plate 30 can be used. In the illustrated arrangement, shields or heat absorbers 32 are also positioned downstream from the susceptor 20 and are preferably positioned on each side of the getter plate 30 and adjacent downstream portions of the side walls 10c. In addition, shields or heat absorbers 33 can also be employed on each side of the central area of the chamber adjacent the central portions of the side walls 10c. These elements 32 and 33 may be held in position by any suitable means. For example, the elements 32 might be positioned by the pins 31, and spaced slightly from the chamber side walls 10c. In such an arrangement, the pins 31 can be fabricated of quartz. If desired, quartz projections can be mounted on the chamber side walls 10c and on the downstream plate 18 to position the elements 32 slightly spaced from the side walls 10c. Similarly, the elements 33 can rest on quartz supports on the chamber lower wall 10b between the chamber side walls 10c and the quartz stand 23 positioned by suitable supports mounted on the side walls 10c to space the upper end of the element 33 slightly from the side walls 10c.

In the illustrated arrangement, two thermocouples 34 are supported beneath the ring by a tubular portion 22a of the ring 22, as best seen in FIG. 4. In the preferred embodiment, the tubular portion 22a is configured such that it curves around the outer periphery of the ring 22. More specifically, the tubular portion 22a preferably extends along one side of the ring 22 and then extends along the front edge of the ring 22 and then to the other side of the ring 22. Preferably, one or both of the thermocouples 34 are configured to fit within the tubular portions so a tip end of thermocouples 34 can be located near the leading edge (i.e., inlet side) of the susceptor 20 at the center of the ring 22. In order to facilitate installation and removal of the curved thermocouples 34, the tubular portion 22a preferably is formed by two half sections, which are removably attached to each other. A modified arrangement that is similar to the arrangement described above is described in U.S. Pat. No. 4,821,674, which was incorporated herein by reference above. It should be appreciated that the tip end of the thermocouples may also be positioned at one side of the susceptor and/or at the trailing edge of the susceptor. The thermocouples may also be positioned in close proximity to the ring, depending on the allowable temperature reading error or offset. It should be appreciated that the reactor 10 can include additional thermocouples, as desired, in other locations within the chamber. For example, a thermocouple can be provided at the trailing edge of the susceptor 20.

The illustrated chamber 10 preferably also includes a central thermocouple 38, shown in FIGS. 1, 2, 4 and 5. The central thermocouple 38 extends upwardly through the tubular shaft 26 and spider 24, with its tip preferably located close to the center of the susceptor 20.

With reference now to FIG. 3, each of the thermocouples 34 preferably includes a sheath 35 that surrounds a support 37, which is preferably made from a ceramic material. A pair of thermocouple wires 36 extend through the support 37 and form a junction 36a, which is preferably located at the forward end of the thermocouple 34 such that the junction 36a lies near the forward or upstream corners of the ring 22. In modified arrangements, the thermocouple 34 can include additional thermocouple junctions between additional pairs of wires within the sheath 35. In such an arrangement, an additional junction can be located adjacent the rear or downstream corners of the ring 22 and/or between the upstream and downstream corners.

To protect the thermocouple 34 from the high temperatures and acidic environment that is typically found in the reaction chamber 10, the sheath 35 is typically made of quartz or other vitreous materials. As described in detail above, such quartz sheaths are useful in protecting the thermocouple 34 during wafer processing. However, frequent thermal cycling of the quartz sheath to temperatures in excess of 1000° C. can cause devitrification of the quartz sheath.

To prevent such devitrification, the thermocouple 34 includes a barrier coating 40 that is preferably formed over the sheath 35. The barrier coating 40 creates a barrier between the vitreous sheath 35 and the acidic environment within the chamber 10. Preferably, the barrier coating 40 is very thin, extremely low in mass, has a reasonable thermal conductivity, and does not appreciably change the surface emissivity of the sheath 35. The barrier coating 40 preferably comprises a material that is more resistant to acids, high temperatures, and thermal cycling than the material of the underlying sheath 35. In choosing a material for the barrier coating 40, the following properties are desirable: capability of molecular deposition, ability to adhere to the material of the underlying sheath, resistance to spalling or flaking, non-insulating (i.e., somewhat thermally conductive), chemically stable and compatible with the environments and materials used in processing and cleaning, and not a source of metals or other contaminants.

The barrier coating 40 is preferably between about 1 and 10,000 angstroms thick, more preferably between about 50 and 5000 angstroms thick, and most preferably between about 500 and 3000 angstroms thick. In one preferred embodiment, the barrier coating 40 comprises an approximately 800 angstrom thick layer of silicon nitride ($SiN_x$, which in its stoichiometric form is $Si_3N_4$). The barrier coating 40 is preferably formed by CVD deposition over the corresponding vitreous component. CVD deposition is advantageous in that it produces a barrier layer that is both thin and that has good adhesion to the underlying component; improving the thermal conductivity of the layer. However, in addition to CVD, sputter or other known methods of material deposition may be used. In addition to silicon nitride, the barrier coating 40 may comprise any high temperature acid resistant coating with similar material properties, including, for example, diamond, titanium nitride, or titanium carbon nitride.

The barrier coating 40 preferably covers the entire vitreous component. However, in some arrangements the barrier layer can cover selected areas of the component that are more susceptible to devitrification. For example, in the illustrated arrangement, the barrier layer is deposited only over the tip of the thermocouple 34 (see FIG. 3) because devitrification occurs most frequently at the tip of the thermocouple sheath 35 where it contacts, or is in close proximity to, the hot susceptor 20. Of course, in a modified arrangement, the barrier coating 40 can cover the entire thermocouple 34, a smaller/larger or different portion of the thermocouple 34.

Figure 5:
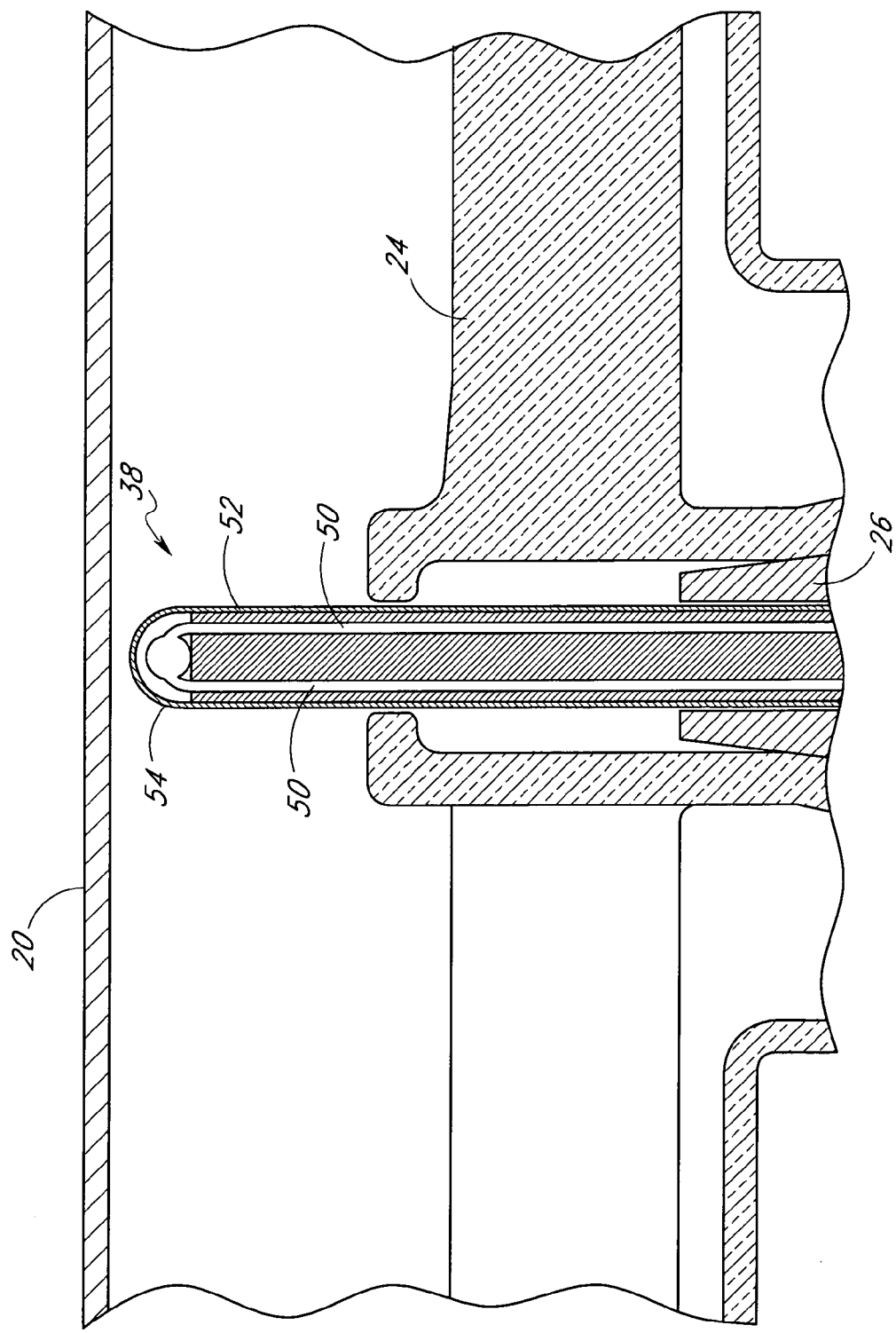
FIG. 5 is a cross-sectional view of a central thermocouple with a barrier coating over a vitreous sheath.

With reference to FIG. 5, the barrier coating is shown with reference to another vitreous component, the central thermocouple 38. The illustrated central thermocouple 38 comprises thermocouple wires 50 surrounded by a quartz sheath 52. A barrier coating 54 is preferably provided over the quartz sheath 52 to protect the thermocouple 38 from processing gases that tend to deposit on the tip of thermocouple, and to prevent devitrification of the quartz sheath 52 as described above. As with the thermocouple 34 described above, the barrier coating 54 covers a portion of the central thermocouple 38. Specifically, in the illustrated arrangement, the barrier coating 54 covers a top portion of the thermocouple.

Other vitreous components in the chamber 10 can also be wholly or partially covered with the barrier coating described above. For example, in the illustrated chamber 10, the spider 24, the quartz tube 27, and the stand 23 are preferably manufactured using quartz. The upwardly extending projections of the spider 24, which contact and support the hot susceptor 20 can particularly benefit from a barrier coating, as described herein. As such, these vitreous components can be covered wholly or partially with the barrier coating 40 so as to protect these components as described above. As such, it should be appreciated that a barrier coating 40 can be provided wherever quartz is found in the chamber, so long as the barrier layer does not substantially interfere with the operation of the chamber. Other reactor components that may comprise quartz, and which may therefore benefit from a protective barrier layer, include support pieces, pins, ledges, projections, etc. typically found within a chamber and used to support other reactor components. In addition to quartz, any amorphous material that is subject to devitrification may be protected with a barrier layer.

As a result of the foregoing techniques, the lifetime of vitreous components, when protected with barrier layers, may be significantly extended. Barrier layers are helpful in preventing devitrification in any vitreous material, including any family of glass subject to devitrification. Specifically, the life of quartz thermocouple sheaths, protected with a barrier later, have been increased by approximately 300 percent. Preventing devitrification of the quartz sheath decreases calibration drift of the thermocouple. Moreover, increasing the lifetime of vitreous components obviously results in lower consumable costs. Likewise, extending the intervals between reactor preventive maintenance result in less down time and less reactor tuning. Less reactor tuning also results in lower use of monitor wafers. Thus, it can be seen that the use of barrier coatings to protect components comprising quartz, or other vitreous materials, in the reactor can provide very significant benefits.

It be noted that while the invention has been described in connection with a particular type reaction chamber 10, the invention can also be applied to other types of reactions chambers.

It should also be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

I claim:

1. A semiconductor processing apparatus comprising a reaction chamber and one or more vitreous components that have a support surface for supporting other components in the reaction chamber, said support surface being covered at least in part by a devitrification barrier coating that is bonded to said support surface and directly contacts said supported other components in the reaction chamber; where said devitrification barrier coating has a thickness between about 1 and 10,000 angstroms.

2. The apparatus of claim 1, wherein said one or more vitreous components are formed from quartz.

3. The apparatus of claim 1, wherein said devitrification barrier comprises silicon nitride.

4. The apparatus of claim 1, wherein said devitrification barrier coating is formed from silicon nitride that has been deposited on said one or more vitreous components using CVD deposition.

5. The apparatus of claim 1, where said devitrification barrier coating has a thickness between about 50 and 5000 angstroms.

6. The apparatus of claim 5, where said devitrification barrier coating has a thickness between about 500 and 3,000 angstroms.

7. The apparatus of claim 6, where said devitrification barrier coating has a thickness of about 800 angstroms.

8. The apparatus of claim 1, where said devitrification barrier coating is selected from the group consisting of silicon nitride, diamond, titanium nitride, titanium carbon nitride, and combinations thereof.

9. The apparatus of claim 1, wherein said devitrification barrier coating covers an entire portion of said support surface of said one or more vitreous components.

10. The apparatus of claim 1, wherein said apparatus further comprises a support device comprising at least one laterally extending member, said radially extending member including an upwardly extending projection that defines said support surface, said projection and support device configured to support a substrate within said apparatus, said support surface of said projection being covered at least in part by said devitrification barrier coating.

11. The apparatus of claim 1, wherein said reaction chamber is a chemical vapor deposition reaction chamber.

12. The apparatus as in claim 1, wherein said devitrification barrier coating is formed from silicon nitride that has been deposited on said one or more vitreous components using sputtering.

13. The apparatus of claim 1, wherein said devitrification barrier coating is formed by CVD.

14. The apparatus of claim 1, wherein said devitrification barrier coating is formed by sputtering.

15. A semiconductor processing apparatus comprising a reaction chamber and a thermocouple, the thermocouple comprising a quartz sheath having an outer surface that is covered at least in part by a devitrification barrier coating having a thickness between about 1 and 10,000 angstroms.

16. The apparatus of claim 15, wherein said devitrification barrier comprises silicon nitride.

17. The apparatus of claim 15, wherein said devitrification barrier coating is formed from silicon nitride that has been deposited on said thermocouple using CVD deposition.

18. The apparatus of claim 15, where said devitrification barrier coating has a thickness between about 50 and 5,000 angstroms.

19. The apparatus of claim 16, where said devitrification barrier coating has a thickness between about 500 and 3,000 angstroms.

20. The apparatus of claim 17, where said devitrification barrier coating has a thickness of about 800 angstroms.

21. The apparatus of claim 15, where said devitrification barrier coating is selected from the group consisting of silicon nitride, diamond, titanium nitride, titanium carbon nitride, and combinations thereof.

22. The apparatus of claim 15, wherein said devitrification barrier coating only covers a portion of said quartz sheath that is most susceptible to devitrification.

23. The apparatus as in claim 15, wherein said devitrification barrier coating is formed from silicon nitride that has been deposited on said thermocouple using sputtering.

24. The apparatus of claim 15, wherein said devitrification barrier coating is formed by CVD.

25. The apparatus of claim 15, wherein said devitrification barrier coating is formed by sputtering.

* * * * *